(12) United States Patent
Coufal et al.

(10) Patent No.: US 12,070,988 B2
(45) Date of Patent: Aug. 27, 2024

(54) SENSOR UNIT FOR VEHICLES

(71) Applicant: Valeo Schalter und Sensoren GmbH, Bietigheim-Bissingen (DE)

(72) Inventors: Bohuslav Coufal, Prague (CZ); Ivan Suchansky, Prague (CZ); Marian Klepac, Prague (CZ)

(73) Assignee: VALEO SCHALTER UND SENSOREN GMBH, Bietigheim-Bissingen (DE)

( * ) Notice: Subject to any disclaimer, the term of this patent is extended or adjusted under 35 U.S.C. 154(b) by 417 days.

(21) Appl. No.: 17/602,609

(22) PCT Filed: Apr. 6, 2020

(86) PCT No.: PCT/EP2020/059710
§ 371 (c)(1),
(2) Date: Oct. 8, 2021

(87) PCT Pub. No.: WO2020/207942
PCT Pub. Date: Oct. 15, 2020

(65) Prior Publication Data
US 2022/0194172 A1 Jun. 23, 2022

(30) Foreign Application Priority Data
Apr. 11, 2019 (DE) .................... 10 2019 109 575.1

(51) Int. Cl.
*B60H 1/00* (2006.01)
*G01J 1/42* (2006.01)
*H05K 1/02* (2006.01)

(52) U.S. Cl.
CPC ..... *B60H 1/00785* (2013.01); *B60H 1/00792* (2013.01); *G01J 1/4204* (2013.01);
(Continued)

(58) Field of Classification Search
CPC ............. B60H 1/00785; B60H 1/00792; G01J 1/4204; H05K 1/0278; H05K 2201/057;
(Continued)

(56) References Cited

U.S. PATENT DOCUMENTS 7,553,166 B2   6/2009 Gobron
7,785,004 B2   8/2010 Kautz et al.
(Continued)

FOREIGN PATENT DOCUMENTS

DE   10 2006 060 546 A1   6/2008
DE      102006060548 A1 *  6/2008   ............ B60S 1/0822
(Continued)

OTHER PUBLICATIONS

Search Report issued in corresponding German Patent Application No. 10 2019 109 575.1, dated Dec. 2, 2019 (9 pages).
(Continued)

*Primary Examiner* — Helen C Kwok
(74) *Attorney, Agent, or Firm* — Osha Bergman Watanabe & Burton LLP

(57) ABSTRACT

A sensor unit for vehicles for detecting at least the moisture and/or the temperature on the inside of a vehicle window by a sensor is disclosed. The sensor unit is mounted adjacent to the inside of the vehicle window, the sensor unit comprises a housing within which it is partially enclosed, the housing has at least one opening in the direction of the vehicle window through which the sensor unit is pressed against the vehicle window. The sensor unit has a printed circuit board (PCB) that is pressed against the inside of the vehicle window when the sensor unit is in the mounted state, and is arranged between the sensor and the vehicle window. The PCB is a rigid-flexible PCB comprising a bend at least in a partial region, the bend of the rigid-flexible PCB being set up in such a way as to generate an elastic restoring force,
(Continued)

Figure 1:
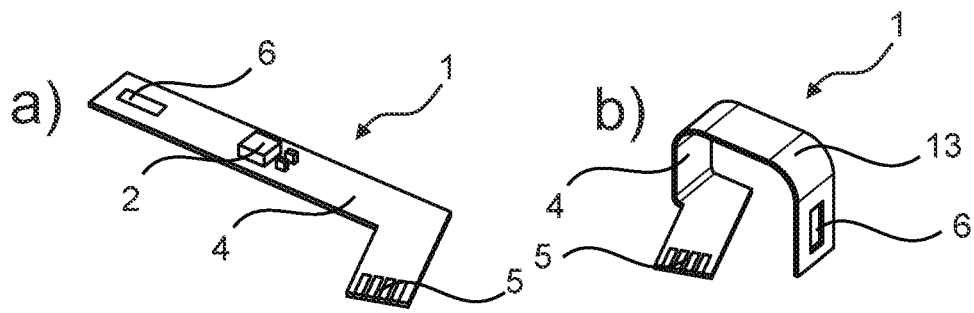

which presses the rigid-flexible PCB against the vehicle window. The rigid-flexible PCB has at least one recess for receiving a fixing means and these together are designed to hold the rigid-flexible PCB in a specific shape.

11 Claims, 2 Drawing Sheets

(52) U.S. Cl.
CPC ..... *H05K 1/0278* (2013.01); *H05K 2201/057* (2013.01); *H05K 2201/10121* (2013.01); *H05K 2201/10151* (2013.01); *H05K 2201/1034* (2013.01)

(58) Field of Classification Search
CPC .......... H05K 2201/10121; H05K 2201/10151; H05K 2201/1034; H05K 2201/048; H05K 2201/053; H05K 2201/055; H05K 2201/09063
See application file for complete search history.

(56) References Cited

U.S. PATENT DOCUMENTS

| | | | | |
|---|---|---|---|---|
| 8,051,707 B2 * | 11/2011 | Roehr | ................... | H05K 1/147 |
| | | | | 73/170.17 |
| 8,859,909 B2 | 10/2014 | Dimmock | | |
| 2008/0066477 A1 * | 3/2008 | Aoki | ..................... | G05D 23/19 |
| | | | | 236/44 A |
| 2008/0258743 A1 * | 10/2008 | Schmitt | .............. | B60H 1/00785 |
| | | | | 324/694 |
| 2009/0134985 A1 * | 5/2009 | Schmitt | ................ | B60S 1/0822 |
| | | | | 340/425.5 |
| 2011/0061445 A1 | 3/2011 | Roehr et al. | | |
| 2012/0006907 A1 * | 1/2012 | Niemann | ........... | B60H 1/00792 |
| | | | | 73/29.02 |
| 2012/0007507 A1 * | 1/2012 | Niemann | ................ | G01D 21/02 |
| | | | | 315/82 |
| 2014/0150540 A1 * | 6/2014 | Lenferink | .............. | G01K 13/02 |
| | | | | 73/114.01 |
| 2022/0187687 A1 * | 6/2022 | Sharma | .................. | H04N 23/80 |
| 2022/0373405 A1 * | 11/2022 | Lee | .......................... | G01K 1/08 |

FOREIGN PATENT DOCUMENTS

| | | | | |
|---|---|---|---|---|
| DE | 102011122456 A1 | | 6/2013 | |
| DE | 102013022060 A1 | | 6/2015 | |
| EP | 1700724 B1 | | 9/2006 | |
| EP | 2296946 B1 | | 5/2013 | |
| EP | 2794380 A1 | | 10/2014 | |
| EP | 3789739 A1 * | | 3/2021 | ............ B60S 1/0881 |
| EP | 3789740 A1 * | | 3/2021 | ............ G01D 11/30 |
| KR | 101124680 | * | 3/2012 | |
| KR | 10 2017 0 018 546 A | | 2/2017 | |

OTHER PUBLICATIONS

International Search Report and Written Opinion issued in corresponding International Patent Application No. PCT/EP2020/059710, mailed Jul. 17, 2020 (10 pages).

* cited by examiner

SENSOR UNIT FOR VEHICLES

The present invention concerns a sensor unit for vehicles to detect at least the humidity and/or temperature on the inside of a vehicle window. The present invention also concerns a driver assistance system with a sensor unit. Furthermore, the present invention concerns a vehicle with a sensor unit. The invention also concerns the use of a sensor unit in an optoelectronic sensor unit to detect the wetting of a vehicle window of the vehicle and/or to detect the ambient light of the vehicle.

DE 10 2006 060 548 A1, for example, describes an optoelectronic rain sensor unit for motor vehicles, with an optical sensor for detecting the wetting of a motor vehicle windscreen, whereby the optical sensor, resting against the motor vehicle windscreen, can be mounted in the area of the area wiped over by a windscreen wiper on the side facing the interior of the motor vehicle. The unit has a housing enclosing the optical sensor in the area facing away from the windscreen with an electrical connection to the electrical system of the vehicle. In addition, a temperature and humidity sensor module is connected to the housing, whereby the electrical supply of the temperature and humidity sensor module takes place via the electrical connection of the optical sensor. It is also provided that a flex printed circuit board is arranged between the temperature and humidity sensor and the motor vehicle window, the flex printed circuit board being connected to a printed circuit board of the optical sensor. The temperature and humidity sensor is pressed against the vehicle windshield by means of a spring element or against the vehicle windshield by means of the elastic restoring force of the flex printed circuit board, thus ensuring a secure, non-positive and stationary fixing.

From EP 1 700 724 B1 a humidity sensor is known comprising a housing adapted to hold a humidity sensor towards the windscreen of a vehicle or other type of window. A flexible circuit board is disposed between the humidity sensor and the windshield and establishes a connection between the humidity sensor and the further circuit of the detector. The humidity sensor is located under a cap that is detected by a sliding element. A spring presses the sliding element against the windscreen.

A disadvantage of the state-of-the-art moisture sensor is that either additional components are required to attach the moisture sensor to a vehicle window or, if the moisture sensor is pressed against the vehicle window by the elastic restoring force of the flex printed circuit board (PCB), the moisture sensor cannot easily be adapted to different distances between the vehicle window and the moisture sensor.

Based on the above-mentioned state of the art, the invention is thus based on the task of indicating a simple attachment of a sensor to a vehicle window, whereby different distances between the sensor and the vehicle window can be reacted to in a simple manner in different installation situations.

The task is solved by the characteristics of the independent claims according to the invention. Advantageous forms of the invention are indicated in the subclaims.

In accordance with the invention, a sensor unit for vehicles is thus specified for detecting at least the moisture and/or the temperature on the inside of a vehicle window by means of at least one sensor, it being possible for the sensor unit to be mounted in contact with the inside of the vehicle window, the sensor unit comprising a housing, the sensor unit being partially enclosed by the housing, the housing comprising at least one opening in the direction of the vehicle window through which the sensor unit can be pressed against the vehicle window, the sensor unit comprising a printed circuit board, the printed circuit board being pressed against the inside of the vehicle window in the mounted state of the sensor unit, the printed circuit board being arranged between the sensor and the vehicle window, the printed circuit board being a rigid-flexible printed circuit board, the rigid-flexible printed circuit board comprising a bend at least in a partial region, the bend of the rigid-flexible printed circuit board being arranged in such a way as to generate an elastic restoring force which presses the rigid-flexible printed circuit board against the vehicle window, characterized in that the rigid-flexible printed circuit board comprises at least one recess for receiving a fixing means, wherein the recess and the fixing means are designed to hold the rigid-flexible printed circuit board in a specific shape.

According to the invention, a driver assistance system with a sensor unit for vehicles to detect at least the humidity of the inside of a vehicle window is also specified.

In addition, a vehicle with a sensor unit for vehicles to detect at least the humidity of the inside of a vehicle window is indicated according to the invention.

Furthermore, the use of the sensor unit in an optoelectronic sensor unit to detect the wetting of a vehicle window of the vehicle and/or to detect the ambient light of the vehicle is in accordance with the invention.

The basic idea of the present invention is that the rigid-flex printed circuit board comprises at least one recess for holding a fixing means. By means of the mounting the rigid-flex PCB and thus the sensor unit can be held in a certain shape and the recess and the fixing element can be used to adjust the height of the sensor unit.

In an advantageous embodiment of the invention, the rigid-flexible circuit board has a substantially elongate shape, the recess having an elongate shape extending substantially parallel to the longitudinal direction of the rigid-flexible circuit board. Due to the elongated shape, the rigid-flex PCB can be made into a rectangular shape. The fixing element holds the printed circuit board in the specified shape. It is advantageous if the recess also has an elongated shape, as the height of the sensor unit can be adjusted with it.

In a further advantageous embodiment of the invention, the rigid-flexible printed circuit board is bent at least in part by at least two bends of about 90° by a total of 180°. By bending the rigid-flexible circuit board several times, a flat area is created on the circuit board of the sensor unit, which can simply be pressed against the vehicle window.

In an advantageous embodiment of the invention, the rigid-flex printed circuit board comprises an electrical plug connection for electrical coupling with other electrical components. The electrical plug-in connection allows the sensor unit to be easily connected to other electrical components.

In a further advantageous embodiment of the invention, the housing of the sensor unit contains the fixing means.

In an advantageous embodiment of the invention, the rigid-flex printed circuit board includes the fixing means.

In a further advantageous embodiment of the invention, the fixing means is formed from at least a part of the rigid-flexible printed circuit board itself.

In an advantageous form of the invention, the fixing means is designed as a hook.

In another advantageous form of the invention, the at least one sensor is a humidity sensor and/or a temperature sensor.

These and other aspects of the invention will be apparent from and elucidated with reference to the embodiments described hereinafter. Individual features disclosed in the embodiments con constitute alone or in combination an aspect of the present invention. Features of the different embodiments can be carried over from one embodiment to another embodiment.

Figure 7:
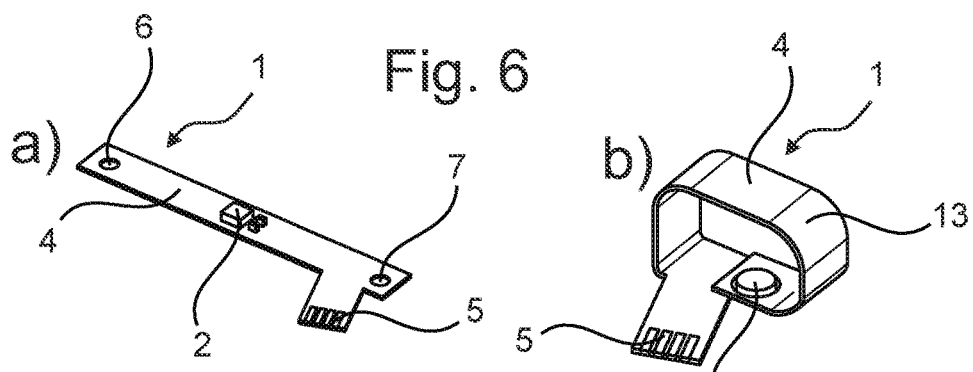
Figure 8:
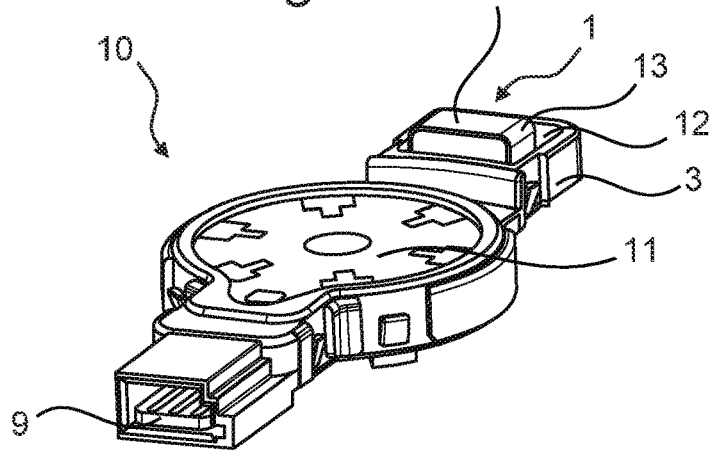

In the drawings:

FIGS. 1a and 1b a schematic view of a sensor unit with a rigid-flexible printed circuit board according to a first example of the invention, FIGS. 2a and 2b a schematic view of a sensor unit with a rigid-flexible printed circuit board according to a second example of the invention, FIGS. 3a and 3b a schematic view of a sensor unit with a rigid-flexible printed circuit board according to a third example of the invention, FIGS. 4a and 4b a schematic view of a sensor unit with a rigid-flexible printed circuit board according to a fourth example of the invention, FIGS. 5a and 5b a schematic view of a sensor unit with a rigid-flexible printed circuit board according to a fifth example of the invention, FIGS. 6a and 6b a schematic view of a sensor unit with a rigid-flexible printed circuit board according to a sixth example of the invention, FIGS. 7a and 7b a schematic view of a sensor unit with a rigid-flexible printed circuit board according to a seventh example of the invention, FIG. 8 a schematic view of the use of a sensor unit having a rigid-flexible circuit board in an optoelectronic sensor unit according to an exemplary embodiment of the invention.

FIG. 1 shows a schematic view of a sensor unit 1 with a rigid-flexible printed circuit board 4 according to a first example of the invention. The sensor unit 1 comprises a sensor 2, e.g. for measuring humidity and/or temperature.

FIG. 1a shows the rigid-flex PCB 4 in a straight state, i.e. without bends. The PCB 4 comprises an electrical plug connection 5, which is intended for electrical contacting with other electrical components. The sensor 2 is arranged in FIG. 1a above the PCB 4 shown. Furthermore, the rigid-flex printed circuit board 4 comprises at least one recess 6, the recess 6 being provided for receiving a fixing means 7.

In FIG. 1b, the rigid-flexible PCB 4 is bent at three points on the PCB 4 to form a rectangular shape. The recess 6 in the rigid-flexible circuit board 4 is located on the right side of the rectangularly shaped circuit board 4. The recess 6 serves in particular to accommodate a fixing means 7. The rectangularly shaped circuit board 4 can, for example, be inserted into a housing 3, whereby the housing 3 comprises an opening 12 opened towards the vehicle window. In the design example shown in FIG. 1b, the fixing means 7 is located on the housing 3 of the sensor unit 1, whereby the fixing means 7 is not shown in FIG. 1b. By engaging the fixing means 7 in the recess 6, the rigid-flexible circuit board 4 is on the one hand held in shape and on the other hand, due to the elongated expansion of the recess 6, it is possible to adjust the height of the formed rigid-flexible circuit board 4.

Figure 2:
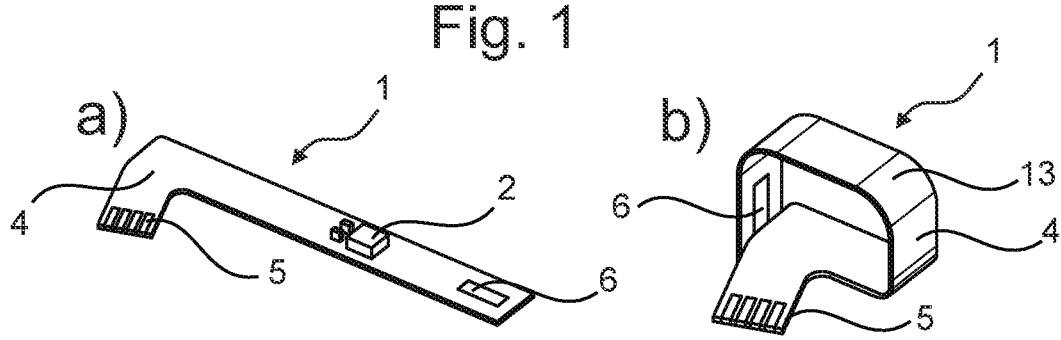

FIG. 2 shows a schematic view of a rigid-flexible printed circuit board 4 according to a second example of the invention. FIG. 2a shows the rigid-flexible circuit board again in a straight state without bends 13. In comparison to the first version, the electrical plug connection 5 and the recess 6 are mirror-inverted to the first version. This allows the rigid-flex PCB 4 to be bent from the other side, allowing the fixing means 7 to be located at another point on the housing 3 of sensor unit 1.

Figure 3:
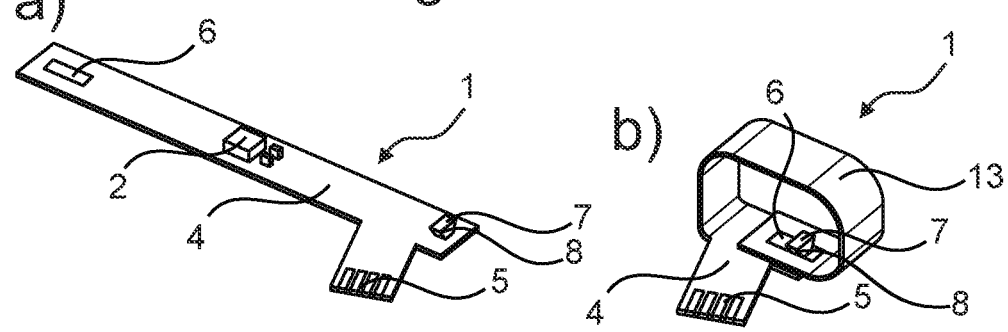

FIG. 3 shows a schematic view of a rigid-flexible printed circuit board 4 according to a third example of the invention. In the example shown in FIG. 3a, the fixing means 7 is arranged on the rigid-flexible printed circuit board 4 itself. For example, the fixing means 7 can be formed from or connected to the printed circuit board itself. The fixing means 7 shown in FIG. 3a has a conically bevelled edge 8, which allows the fixing means 7 to be held securely in the recess 6. FIG. 3b shows the rigid-flexible printed circuit board 4 in a bent state, with the fixing means 7 being inserted through the recess 6 and held securely in the recess 6 by its conically bevelled edges 8. Due to the elongated shape of the recess 6, it is also possible to adjust the height of the formed rigid-flexible printed circuit board 4 in this version.

Figure 4:
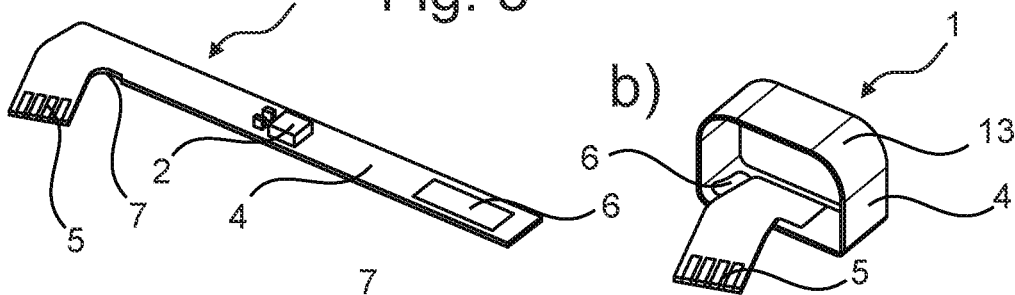

FIG. 4 shows a schematic view of a rigid-flexible printed circuit board 4 according to a fourth example of the invention. FIG. 4a shows that the recess 6 in the rigid-flexible circuit board 4 is larger than in the previous versions. The recess 6 is so large that the rigid-flex PCB 4 can be inserted through the recess 6 and thus fixes itself. FIG. 4b shows how the end with the electrical plug connection 5 was inserted through the recess 6 and thus a rectangular shape of the rigid-flexible PCB 4 is created. In addition, the rigid-flexible circuit board 4 has a notch 7 for fixing the rigid-flexible circuit board 4 in the recess 6. Depending on how far the end with the electrical plug connection 5 is pushed through the recess 6, the height of the sensor unit 1 can be adjusted.

Figure 5:
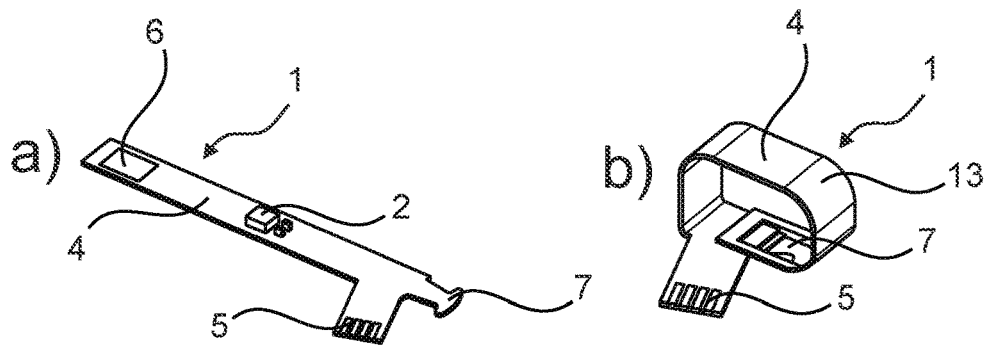

FIG. 5 shows a schematic view of a rigid-flex PCB 4 according to a fifth example of the invention. In the design shown in FIG. 5a, the rigid-flexible circuit board 4 in turn has a recess 6 to accommodate a fixing means 7. In this exemplary embodiment, the fixing means 7 is formed from a part of the rigid-flexible circuit board 4 itself. The fixing means 7 is designed as a hook which holds the rigid-flex PCB 4 together with the recess 6 in a rectangular shape.

Figure 6:
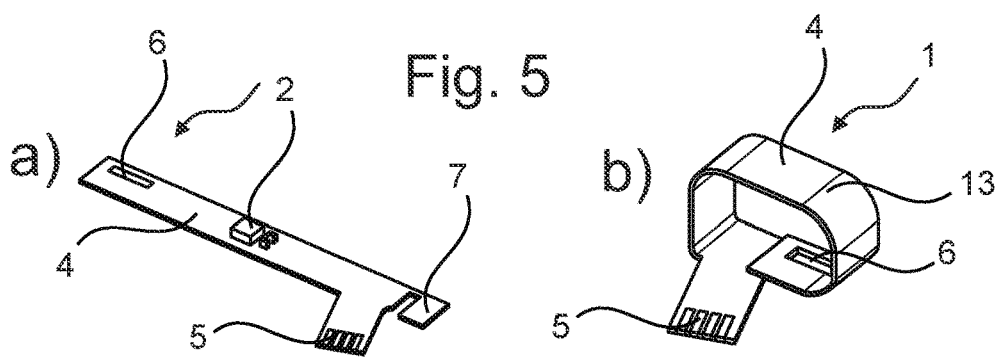

FIG. 6 shows a schematic view of a rigid-flexible circuit board 4 according to a sixth example of the invention. In FIG. 6a, the recess 6 is a narrow slit-shaped rectangle. Through the narrow slot 6 a part of the rigid-flexible circuit board 4 is inserted and the rigid-flexible circuit board 4 is fixed in its shape. The slot 6 should therefore not be narrower than the thickness of the PCB 4.

FIG. 7 shows a schematic view of a rigid-flexible printed circuit board 4 according to a seventh example of the invention. FIG. 7a shows that the recess 6 can be round. This exemplary embodiment can therefore also be equipped with a round fixing means 7. The fixing means 7 can be inserted through the round recess 6 and hold the rigid-flexible PCB 4 in its shape. In particular, several round recesses 6 can also be provided, whereby an easy height adjustment of the sensor unit 1 can be achieved.

FIG. 8 shows a schematic view of the use of a sensor unit 1 with a rigid-flexible printed circuit board 4 in an optoelectronic sensor unit 10 according to an exemplary embodiment of the invention. The optoelectronic sensor unit 10 comprises an optical sensor 11 for detecting the wetting of a vehicle window of the vehicle and/or for detecting the ambient light of the motor vehicle, wherein the optical sensor 11 is mounted on a main board which can be mounted adjacent to the inner side of the vehicle window. In the front area of the optoelectronic sensor unit 10 an installation plug 9 is visible. The installation plug 9 is used, for example, to connect the optoelectronic sensor unit 10 with the on-board electronics of the vehicle and in particular with a driver assistance system. A sensor unit 1 can be seen at the opposite end to the installation plug 9 in FIG. 8, wherein the sensor unit 1 comprises at least one sensor 2 for detecting the humidity and/or temperature on the inside of a vehicle window. The sensor 2 of the sensor unit 1 is mounted on a printed circuit board 4, the printed circuit board 4 being pressed against the inside of the vehicle window when the sensor unit 1 is mounted. The printed circuit board 4 is located between sensor 2 and the vehicle window. Since the sensor 2 is mounted underneath circuit board 4, it cannot be seen in FIG. 8. The circuit board 4 carrying the sensor 2 is designed as a rigid-flexible circuit board 4, whereby the rigid-flexible circuit board 4 has an essentially elongated shape. The optoelectronic sensor unit 10 and the sensor unit 1 are partially enclosed in a common housing 3. The rigid-flex PCB 4 is bent in such a way that the sensor unit 1 can be inserted into the housing 3. In different installation situations, for example in different vehicle types, it can be advantageous if the height of the rigid-flexible PCB can be adjusted to the level of the optoelectronic sensor unit defined by the middle area of the main board. Therefore, the rigid-flex printed circuit board includes at least one recess for holding a fixing means, as shown in more detail in the exemplary embodiments in FIGS. 2 to 8.

FIG. 8 shows that the rigid-flex printed circuit board 4 projects slightly beyond the housing of the optoelectronic sensor unit 10 when not mounted. In the mounted state of the optoelectronic sensor unit 10, the bending of the rigid-flexible PCB 4 generates an elastic restoring force which presses the PCB 4 and thus also the sensor 2 attached to the PCB 4 against the vehicle window. This enables a reliable measurement of the humidity and/or temperature inside the vehicle.

In FIG. 8 the sensor unit 1 is electrically coupled with the optoelectronic sensor unit 11. In particular, it can be provided that the sensor unit 1 has an electrical plug connection 5 with which the sensor unit 1 is electrically coupled to the optoelectronic sensor unit 11.

REFERENCE SIGNS LIST 1 sensor unit
2 sensor
3 housing
4 rigid-flex printed circuit board
5 electrical plug connection
6 recess
7 fixing means
8 bevelled edge
9 installation plug
10 optoelectronic sensor unit
11 optical sensor
12 opening
13 bending

The invention claimed is:

1. A sensor unit for vehicles for detecting at least a moisture and/or a temperature on an inside of a vehicle window by at least one sensor, the sensor unit configured to be mounted in contact with the inside of the vehicle window, the sensor unit comprising:

a housing, the sensor unit being partially enclosed by the housing, the housing comprising at least one opening in a direction of the vehicle window through which the sensor unit is pressed against the vehicle window;

a printed circuit board that is pressed against the inside of the vehicle window when the sensor unit is in a mounted state, the printed circuit board being arranged between the at least one sensor and the vehicle window, the printed circuit board being a rigid-flexible printed circuit board comprising a bend at least in a partial region, the bend of the rigid-flexible printed circuit board being set up in such a way as to generate an elastic restoring force, which presses the rigid-flexible printed circuit board against the vehicle window, wherein the rigid-flexible printed circuit board comprises at least one recess for receiving a fixing means, wherein the rigid-flexible printed circuit board has a substantially elongate shape, wherein the at least one recess and the fixing means are collectively configured to hold the rigid-flexible printed circuit board in a specific shape, and wherein the at least one recess has an elongate shape which extends substantially parallel to a longitudinal direction of the rigid-flexible printed circuit board and is configured to adjust a height of the rigid-flexible printed circuit board.

2. The sensor unit according to claim 1, wherein the rigid-flexible printed circuit board is bent at least in one partial region by at least two bends of approximately 90° by a total of 180°.

3. The sensor unit according to claim 1, wherein the rigid-flexible printed circuit board comprises an electrical plug connection for electrical coupling with further electrical components.

4. The sensor unit according to claim 1, wherein the housing of the sensor unit comprises the fixing means.

5. The sensor unit according to claim 1, wherein the rigid-flexible printed circuit board comprises the fixing means.

6. The sensor unit according to claim 5, wherein the fixing means is formed from at least one part of the rigid-flexible printed circuit board itself.

7. The sensor unit according to claim 6, wherein the fixing means is a hook.

8. The sensor unit according to claim 1, wherein the at least one sensor is a humidity sensor and/or a temperature sensor.

9. A driver assistance system with the sensor unit according to claim 1.

10. A vehicle with the sensor unit according to claim 1.

11. The sensor unit of claim 1, wherein the sensor unit is used in an optoelectronic sensor unit for detecting a wetting of the vehicle window and/or for detecting an ambient light of a vehicle.

* * * * *